United States Patent [19]
Ishiguro

[11] Patent Number: 6,042,899
[45] Date of Patent: Mar. 28, 2000

[54] METHOD OF MANUFACTURING A THIN-FILM MAGNETIC DEVICE

[75] Inventor: Akira Ishiguro, Kawasaki, Japan

[73] Assignee: Kabushiki Kaisha Toshiba, Kawasaki, Japan

[21] Appl. No.: 09/172,851

[22] Filed: Oct. 15, 1998

[30] Foreign Application Priority Data

Oct. 17, 1997 [JP] Japan ................................. 9-285012

[51] Int. Cl.$^7$ ........................................................ H01F 1/00
[52] U.S. Cl. .......................... 427/548; 427/130; 427/131; 427/132; 427/258; 427/264; 427/270; 427/271; 427/372.2; 427/402; 427/599; 437/225; 437/226
[58] Field of Search ..................................... 427/548, 130, 427/131, 132, 258, 264, 270, 271, 372.2, 402, 599; 437/225, 226

Primary Examiner—Bernard Pianalto
Attorney, Agent, or Firm—Finnegan, Henderson, Farabow, Garrett & Dunner, L.L.P.

[57] ABSTRACT

In a method of manufacturing a thin-film magnetic device having a magnetic film provided with uniaxial magnetic anisotropy, the magnetic film, which is formed on a Si wafer, is patterned, before it is heat-treated in a magnetic field, in such a manner that the length of the magnetic film in a direction parallel to that of the magnetic field is greater than the length of the magnetic film in a direction perpendicular thereto. The magnetic film is divided into band-like magnetic films, and the band-like magnetic films are heat-treated in the magnetic field and each provided with uniaxial magnetic anisotropy. The band-like magnetic films are patterned and each divided again into magnetic films of a chip size. Thus, a crack or a blister can be prevented from occurring on the magnetic film, and the magnetic characteristics of the magnetic film can be prevented from deteriorating.

10 Claims, 4 Drawing Sheets

DIRECTION OF MAGNETIC FIELD →

DIRECTION OF MAGNETIC FIELD →

DIRECTION OF
MAGNETIC FIELD →

DIRECTION OF
MAGNETIC FIELD →

DIRECTION OF MAGNETIC FIELD

METHOD OF MANUFACTURING A THIN-FILM MAGNETIC DEVICE

BACKGROUND OF THE INVENTION

The present invention relates to a method of manufacturing a thin-film magnetic device and, more specifically, to a method of manufacturing a thin-film magnetic device having a magnetic film provided with uniaxial magnetic anisotropy.

In a conventional method of manufacturing a thin-film magnetic device having an inductor structure, generally, a magnetic film is formed on a wafer and then heat-treated together with the wafer in a magnetic field in order to provide the magnetic film with uniaxial magnetic anisotropy. If, as illustrated in FIG. 1, a thin-film magnetic device is constituted by forming a magnetic film (FeCoBC) 3 having a thickness of several micrometers on a Si wafer 1 having a diameter of 100 mm or more with an insulation film 2 of $SiO_2$ or SiN therebetween, there is a ratio of quadruple or more digits between the thickness of the magnetic film 3 and the size of the Si wafer 1; therefore, a demagnetizing field is suppressed on the magnetic film 3 and an external magnetic field is applied to the film 3 effectively.

Since, however, the stress of the magnetic film 3 is great, a crack 5 is easy to occur in the heat-treated magnetic film 3' due to a difference in stress between the magnetic film 3 and its underlying layer (wafer or insulation film) 4. The crack 5 degrades yield when the magnetic film 3' is divided into chips by the subsequent patterning.

If the underlying layer 4 is outgassed at the time of heat treatment, the gas is confined by the magnetic film 3' until the film 3' is divided into chips. For this reason, the magnetic film 3' comes off the underlying layer 4 or a blister occurs.

In order to resolve the above problems, as shown in FIGS. 3A, 3B and 3C, the magnetic film 3, which is formed on the Si wafer 1 with the insulation film 2 interposed therebetween, can be divided into chips and then subjected to heat treatment in the magnetic field. Since, in this method, the above-described difference in stress can be lessened by patterning the magnetic film 3 prior to the heat treatment, a crack can be prevented from occurring. Since, furthermore, gas is emitted from an exposed portion of the underlying layer 4, a blister can be prevented from occurring.

In the above method, however, the magnetic film 3 is cut short in a direction parallel to that of the magnetic field before the heat treatment and thus the magnetic characteristics of the magnetic film 3' deteriorates after the heat treatment.

It is generally known that the magnetic film 3, which is provided with uniaxial magnetic anisotropy, is excellent in magnetic characteristics if the ratio between the short side (which is perpendicular to the direction of the magnetic field) of the patterned film 3 and the long side (which is parallel to the direction of the magnetic field) thereof is larger.

However, when the magnetic film 3 is divided into chips each about several millimeters square, the ratio between the thickness of the magnetic film 3 and the size of the Si wafer 1 is about triple digits and thus a demagnetizing field is strengthened on the film 3. As a result, an external field is weakened, and uniaxial magnetic anisotropy cannot sufficiently be applied to the film 3 by the heat treatment in the magnetic field.

BRIEF SUMMARY OF THE INVENTION

As described above, in a conventional method of manufacturing a thin-film magnetic device, a magnetic film is divided into chips prior to heat treatment in a magnetic field to prevent a crack or a blister from occurring; however, uniaxial magnetic anisotropy cannot sufficiently be applied to the magnetic film by the heat treatment.

It is thus accordingly an object of the present invention to provide a method of manufacturing a thin-film magnetic device capable of preventing a crack or a blister from occurring and preventing a magnetic film from deteriorating in magnetic characteristics.

To attain the above object, there is provided a method of manufacturing a thin-film magnetic device, comprising:

a first step of patterning a magnetic film formed on a semiconductor substrate, before the magnetic film is heat-treated in a magnetic field, in such a manner that a length of the magnetic film in a direction parallel to that of the magnetic field is greater than a length of the magnetic film in a direction perpendicular thereto;

a second step of heat-treating the magnetic film in the magnetic field to provide the magnetic film with uniaxial magnetic anisotropy; and a third step of dividing the magnetic film.

There is also provided a method of manufacturing a thin-film magnetic device, comprising:

a first step of patterning a first magnetic film formed on a semiconductor substrate, before the first magnetic film is heat-treated in a magnetic field, in such a manner that a length of the first magnetic film in a direction parallel to that of the magnetic field is greater than a length of the magnetic film in a direction perpendicular thereto;

a second step of heat-treating the first magnetic film in the magnetic field to provide the first magnetic film with uniaxial magnetic anisotropy;

a third step of dividing the first magnetic film according to a chip size;

a fourth step of forming a metal material layer on the first magnetic film, with a first insulation layer interposed therebetween; and a fifth step of forming a second magnetic film on the metal material layer, with a second insulation layer interposed therebetween.

According to the above-described methods of manufacturing a thin-film magnetic device, even when a magnetic film is patterned before it is heat-treated in a magnetic field, a demagnetizing field can be decreased on the magnetic film. Consequently, a crack or a blister can be prevented from occurring on the magnetic film and uniaxial magnetic anisotropy can adequately be applied to the magnetic film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Embodiments of the present invention will now be described with reference to the accompanying drawings.

Figure 4A:
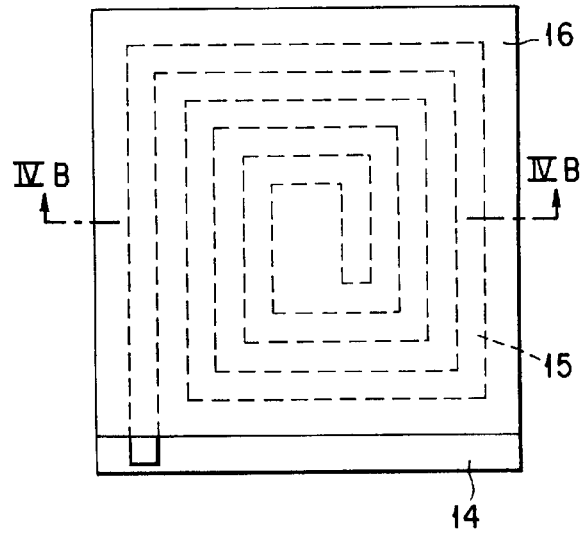
FIG. 4A is a schematic, plan view of a thin-film magnetic device having an inductor structure according to an embodiment of the present invention.
Figure 4B:
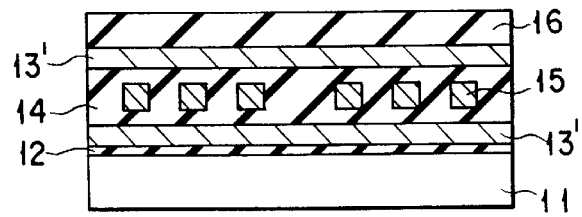
FIG. 4B is a schematic, cross-sectional view thereof.

FIGS. 4A and 4B schematically show the constitution of a thin-film magnetic device having an inductor structure according to an embodiment of the present invention. FIG. 4A is a plan view of the thin-film magnetic device, while FIG. 4B is a cross-sectional view thereof taken along line IVB—IVB of FIG. 4A.

The thin-film magnetic device of the present invention is constituted as follows. A Si wafer having a diameter of 100 mm or more is cut into substrates (chips) 11 each about several millimeters square. An insulation film 12 of $SiO_2$ or SiN is formed on the surface of the substrate 11, and a magnetic film 13' having a thickness of several micrometers, which is sufficiently provided with uniaxial magnetic anisotropy, is formed on the film 12. A polyimide film 14 is formed on the magnetic film 13', and coil layers 15, each of which is constituted by forming a metal wire spirally or rectangular-double-spirally, are included in the polyimide film 14. A magnetic film 13' is also formed on the polyimide film 14, and a passivation film 16 is formed so as to cover the surface of the film 13'.

A method of manufacturing a thin-film magnetic device having the above constitution, will be described in brief.

FIGS. 5A, 5B, 5C and 5D schematically show a flow of processing for forming the magnetic film 13' to which uniaxial magnetic anisotropy is applied sufficiently. In this method, a magnetic film (e.g., FeCoBC) 13 having a thickness of several micrometers is formed by sputtering on the Si wafer having a diameter of 100 mm or larger, with an insulation film interposed therebetween (see FIG. 5A).

First a band-like resist pattern (not shown) is formed on the magnetic film 13 by normal photolithography. The length of the resist pattern in a direction parallel to that of the magnetic field generated at the time of heat treatment is greater than that in a direction perpendicular thereto. The magnetic film 13 is etched using the resist pattern as a mask and divided into band-like magnetic films 13a. The length of each of the films 13a in the direction parallel to that of the magnetic field is greater than that in the direction perpendicular thereto (see FIG. 5B).

The resist pattern is formed as follows. A resist film having an almost uniform thickness is patterned like a band along some of dicing lines. For example, the resist film is etched along all dicing lines parallel to the direction of the magnetic field.

Figure 5A:
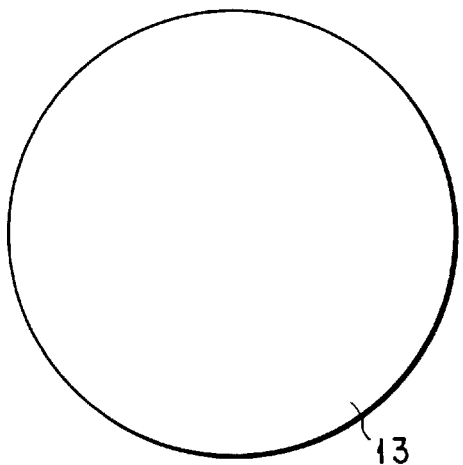
FIGS. 5A, 5B, 5C and 5D are plan views of the main part of the thin-film magnetic device in order to explain a method of manufacturing the same.
Figure 5C:
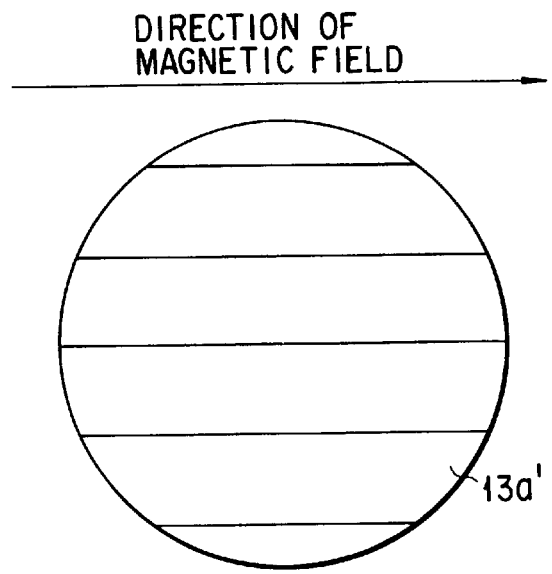
Figure 5B:
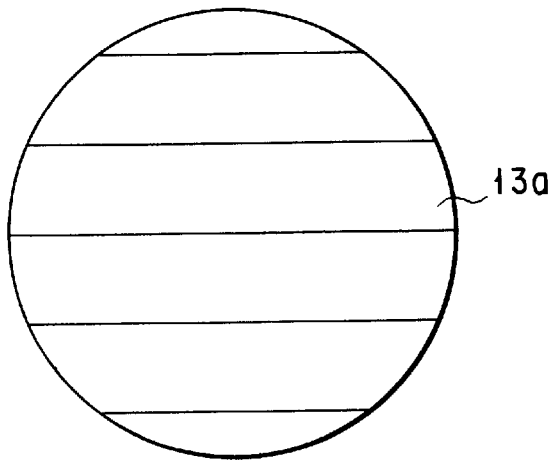

After that, the bank-like magnetic films 13a are heat-treated in the magnetic field and provided with uniaxial magnetic anisotropy (see FIG. 5C). Since the magnetic film 13 is divided into the band-like magnetic films 13a before the heat treatment, a difference in stress between the magnetic film 13 and its underlying layer (Si wafer or insulation film), which is caused by the heat treatment, can be decreased, and no cracks occur in the magnetic films 13a' after the heat treatment. Even though the underlying layer is outgassed when the magnetic film 13 is heat-treated, no blisters (exfoliation) occur because the gas is emitted from an exposed portion of the underlying layer.

Figure 1:
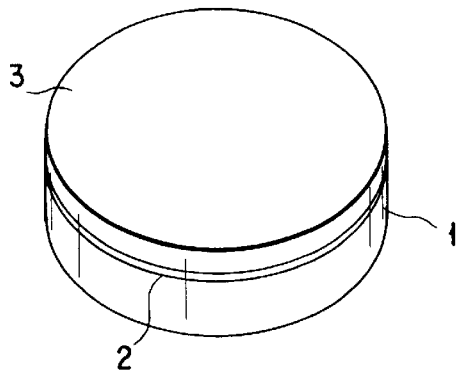
FIG. 1 is a schematic, perspective view illustrating the main part of a conventional thin-film magnetic device in order to explain uniaxial magnetic anisotropy applied to a magnetic film.
Figure 2A:
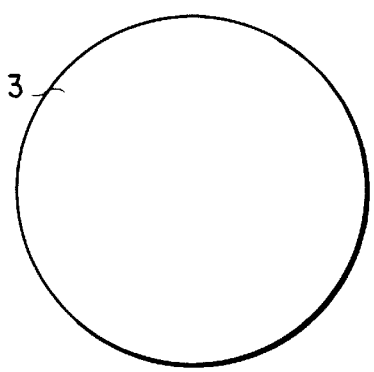
FIGS. 2A, 2B and 2C are schematic, plan views illustrating the main part of the conventional thin-film magnetic device in order to explain a first method and its problem caused by the application of the uniaxial magnetic anisotropy to the magnetic film.
Figure 2B:
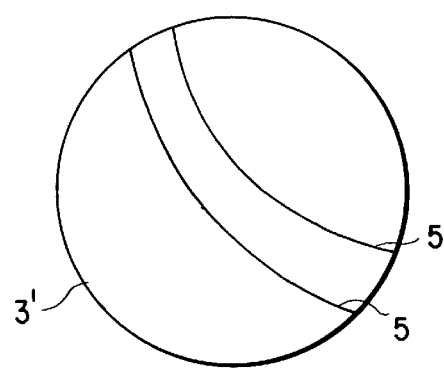
Figure 2C:
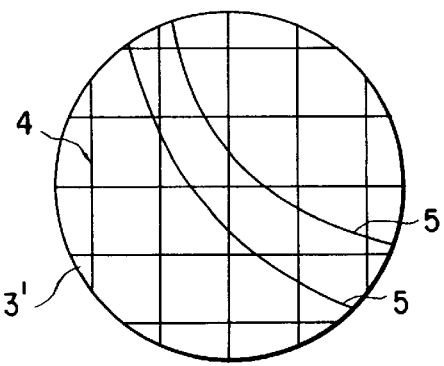

Furthermore, the magnetic film 13 formed on the wafer is patterned only in the direction parallel to that of the magnetic field generated when it is heat-treated and divided into band-like magnetic films 13a, and the magnetic films 13a are heat-treated in the magnetic field. Therefore, not only a crack or a blister can be prevented from occurring, but also substantially the same magnetic characteristics can be obtained from the heat-treated magnetic films 13a' as those in the conventional case where a magnetic film is not divided but heat-treated in the magnetic field (see FIGS. 2A, 2B and 2C). Since the length of the magnetic films 13a in the direction parallel to that of the magnetic field is considered to be the size of the wafer, the ratio between the thickness of the magnetic films 13a and the size of the Si wafer can be maximized; accordingly, the heat-treated magnetic films 13a' can be improved in magnetic characteristics.

Since the ratio between the short side of each of the magnetic films 13a, which have not been heat-treated, in the direction perpendicular to that of the magnetic field and the long side thereof in the direction parallel thereto, can be increased and thus a demagnetizing field can be suppressed on the magnetic films 13a, and an external magnetic field can be applied to the films more effectively. If, for example, the ratio of the short side to the long side is 1 to 2, the demagnetizing field is reduced to about ½, with the result that the magnetic films 13a can be provided with uniaxial magnetic anisotropy sufficiently by heat treatment in the magnetic field and the heat-treated magnetic films 13a' can be improved in magnetic characteristics.

Figure 5D:
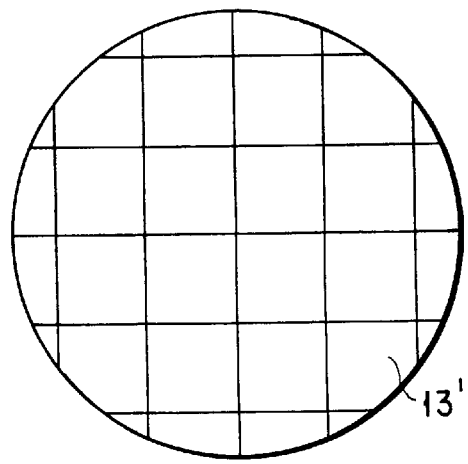

After the heat treatment in the magnetic field, the band-like magnetic films 13a' provided with the uniaxial magnetic anisotropy are each patterned along the other dicing lines (which are all perpendicular to the direction of the magnetic field at the time of heat treatment and which are not used for forming the band-like magnetic films 13a) and divided into almost chip-sized magnetic films 13' (see FIG. 5D).

After a predetermined step is completed, the Si wafer is cut along all the dicing lines to obtain a thin-film magnetic device having an inductor structure as shown in FIGS. 4A and 4B. More specifically, a polyimide film 14 is formed on each of the magnetic films 13', and metal material layers are patterned spirally to form coil layers 15 of metal wires. The coil layers 15 are surrounded by the polyimide film 14 to form the magnetic films 13' which are sufficiently provided with the uniaxial magnetic anisotropy, as shown in the above case.

A passivation film 16 is formed so as to cover the surface of each of the magnetic films 13'. The Si wafer is separated into chips to simultaneously obtain a plurality of thin-film magnetic devices having an inductor structure.

As described above, even when the magnetic films are patterned prior to the heat treatment in the magnetic field, the demagnetizing field can be decreased in the magnetic films. In other words, each of the magnetic films is patterned like a band such that the length in the direction parallel to that of the magnetic field is greater than that in the direction perpendicular thereto before the heat treatment in the magnetic field. Thus, the ratio between the thickness of the magnetic film and the size of the Si wafer can be made larger than that in the conventional case where the magnetic film is divided into almost chip-sized films; therefore, a crack or a blister can be prevented from occurring and uniaxial magnetic anisotropy can sufficiently be applied to the magnetic films. Consequently, the magnetic characteristics of the magnetic films can be prevented from deteriorating.

Moreover, the band-like patterning of the magnetic films before the heat treatment in the magnetic field, prevents the Si wafer from being warped and prevents the exposure patterns from being shifted in the exposure processing when the thin-film magnetic devices are formed.

In the foregoing embodiment, the magnetic films are patterned like a band before they are heat-treated in the magnetic field. The present invention is not limited to this. For example, as illustrated in FIGS. 6A, 6B, 6C and 6D, the magnetic film 13 can be divided into oblong magnetic films 13b such that the length of each of the films 13b in a direction parallel to that of the magnetic field is greater than that in a direction perpendicular thereto, and then subjected to heat treatment in the magnetic field.

More specifically, by normal photolithography, an oblong resist pattern (not shown) is formed on the magnetic film 13 such that the length thereof in a direction parallel to that of the magnetic field is greater than that in a direction perpendicular thereto when the magnetic film is heat-treated. Using the resist pattern as a mask, the magnetic film is etched and divided into oblong magnetic films 13b such that the length in the direction parallel to that of the magnetic field is greater than that in the direction perpendicular thereto (see FIGS. 6A and 6B).

The above resist pattern is formed by patterning a resist film having an almost uniform thickness, like an oblong, along some of dicing lines. For example, the resist film is etched along all the dicing lines parallel to the direction of the magnetic field generated when it is heat-treated, and it is etched along every several dicing lines (one dicing line in this embodiment) perpendicular thereto, thereby forming an oblong resist pattern.

Figure 6A:
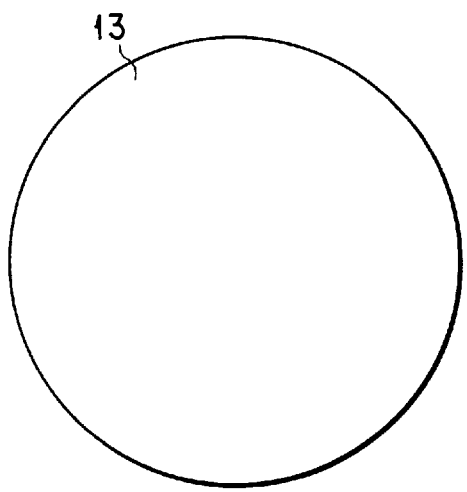
FIGS. 6A, 6B, 6C and 6D are plan views of the main part of a thin-film magnetic device according to another embodiment of the present invention in order to explain a method of manufacturing the same.
Figure 6C:
Figure 6C:
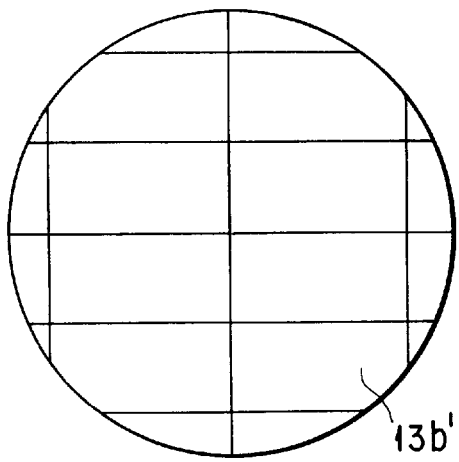
Figure 6B:
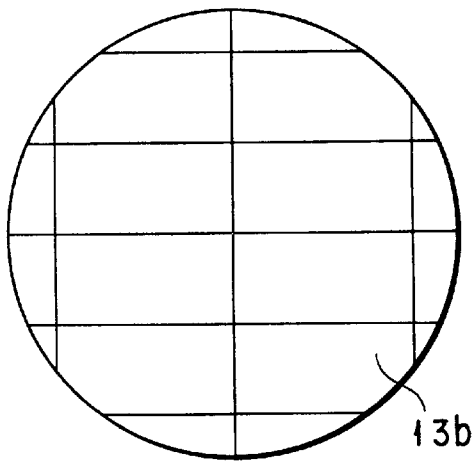

After that, the oblong magnetic films 13b are heat-treated in the magnetic field and provided with uniaxial magnetic anisotropy (see FIG. 6C).

Figure 6D:
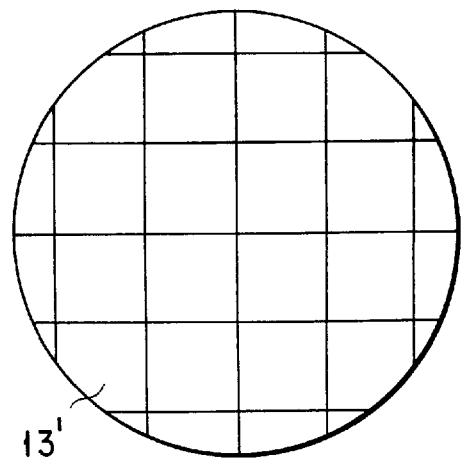

After the heat treatment in the magnetic field, the oblong magnetic films 13b' provided with the uniaxial magnetic anisotropy are each divided into almost chip-sized magnetic films 13' by patterning along the other dicing lines (which correspond to some of dicing lines perpendicular to the direction of the magnetic field at the time of the heat treatment and which are not used for forming the oblong magnetic films 13b) (see FIG. 6D).

After the same step as described above is completed, the Si wafer is cut along all the dicing lines to obtain a thin-film magnetic device having an inductor structure as shown in FIGS. 4A and 4B.

Figure 3A:
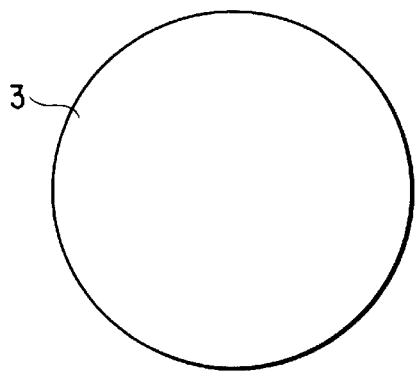
FIGS. 3A, 3B and 3C are schematic, plan views illustrating the main part of the conventional thin-film magnetic device in order to explain a second method and its problem caused by the application of the uniaxial magnetic anisotropy to the magnetic film.
Figure 3B:
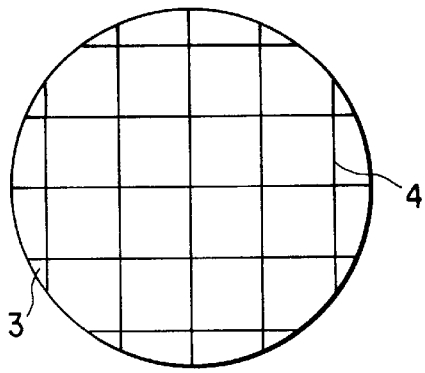
Figure 3C:
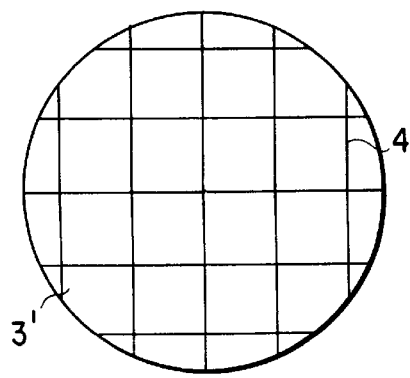

In the latter embodiment of the present invention, if the length of each of the oblong magnetic films 13b in the direction perpendicular to the magnetic field is set almost equal to the chip size, and that in the direction parallel thereto is about twice as great as the chip size (size of two chips), the ratio between the thickness of each of the magnetic films 13b and the size of the Si wafer can be made larger than in the conventional case where the magnetic film is divided into magnetic films each about several millimeters square (almost corresponding to chip size) (see FIGS. 3A to 3C); accordingly, the heat-treated magnetic films 13b' can be improved in magnetic characteristics.

Similarly, the Si wafer can be prevented from being warped and the exposure patterns can be prevented from being shifted in the exposure processing when the thin-film magnetic devices are formed.

The present invention is not limited to a thin-film magnetic device having an inductor structure, but can be applied to various types of thin-film magnetic devices which are provided with uniaxial magnetic anisotropy by heat-treating a magnetic film in the magnetic field.

The number of magnetic films obtained by dividing a magnetic film, which is patterned like an oblong or a band, is not restricted, nor is the size of each of the magnetic films. The objective of the magnetic films can be achieved if they produce the optimum effect in accordance with the size of the Si wafer and that of the chip.

Needless to say, various changes and modifications can be made without departing from the scope of the subject matter of the present invention.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method of manufacturing a thin-film magnetic device, comprising:

a first step of patterning a magnetic film formed on a semiconductor substrate, before the magnetic film is heat-treated in a magnetic field, in such a manner that a length of the magnetic film in a direction parallel to that of the magnetic field is greater than a length of the magnetic film in a direction perpendicular thereto;

a second step of heat-treating the magnetic film in the magnetic field to provide the magnetic film with uniaxial magnetic anisotropy; and a third step of dividing the magnetic film.

2. The method according to claim 1, wherein the magnetic film is patterned like a band.

3. The method according to claim 1, wherein the magnetic film is patterned like an oblong.

4. The method according to claim 1, wherein the magnetic film is divided in accordance with a chip size.

5. A method of manufacturing a thin-film magnetic device, comprising:

a first step of patterning a first magnetic film formed on a semiconductor substrate, before the first magnetic film is heat-treated in a magnetic field, in such a manner that a length of the first magnetic film in a direction parallel to that of the magnetic field is greater than a length of the magnetic film in a direction perpendicular thereto;

a second step of heat-treating the first magnetic film in the magnetic field to provide the first magnetic film with uniaxial magnetic anisotropy;

a third step of dividing the first magnetic film according to a chip size;

a fourth step of forming a metal material layer on the first magnetic film, with a first insulation layer interposed therebetween; and a fifth step of forming a second magnetic film on the metal material layer, with a second insulation layer interposed therebetween.

6. The method according to claim 5, wherein the magnetic film is patterned like a band.

7. The method according to claim 5, wherein the magnetic film is patterned like an oblong.

8. The method according to claim 5, wherein said fifth step includes a step of patterning the second magnetic film, before the second magnetic film is heat-treated in the magnetic field, in such a manner that a length of the second magnetic film in a direction parallel to that of the magnetic field is greater than a length of the second magnetic film in a direction perpendicular thereto, a step of heat-treating the second magnetic film in the magnetic field to provide the second magnetic film with uniaxial magnetic anisotropy, and a step of dividing the second magnetic film in accordance with the chip size.

9. The method according to claim 5, further comprising a sixth step of forming a protection film for covering the second magnetic film.

10. The method according to claim 5, further comprising a seventh step of separating the semiconductor substrate into chips.

\* \* \* \* \*